United States Patent
Kelley et al.

(10) Patent No.: US 11,538,948 B2
(45) Date of Patent: Dec. 27, 2022

(54) QUANTUM DOT PHOTOVOLTAIC JUNCTIONS

(71) Applicant: UNIVERSITY OF SOUTH CAROLINA, Columbia, SC (US)

(72) Inventors: Mathew Kelley, Columbia, SC (US); Andrew B. Greytak, Columbia, SC (US); Mvs Chandrashekhar, Lexington, SC (US); Joshua Letton, Columbia, SC (US)

(73) Assignee: University of South Carolina, Columbia, SC (US)

( * ) Notice: Subject to any disclaimer, the term of this patent is extended or adjusted under 35 U.S.C. 154(b) by 0 days.

(21) Appl. No.: 16/857,687

(22) Filed: Apr. 24, 2020

(65) Prior Publication Data

US 2020/0411707 A1   Dec. 31, 2020

Related U.S. Application Data

(60) Provisional application No. 62/866,857, filed on Jun. 26, 2019.

(51) Int. Cl.
*H01L 31/0352* (2006.01)
*H01L 31/0224* (2006.01)
(Continued)

(52) U.S. Cl.
CPC ........ *H01L 31/035218* (2013.01); *H01L 31/022408* (2013.01); *H01L 31/0312* (2013.01);
(Continued)

(58) Field of Classification Search
CPC ....... H01L 31/022048; H01L 31/03048; H01L 31/0312; H01L 31/0324; H01L 31/0336; H01L 31/035218; H01L 31/18
See application file for complete search history.

(56) References Cited

U.S. PATENT DOCUMENTS

2007/0132052 A1* 6/2007 Sargent .............. H01L 51/4253
257/443
2008/0216891 A1* 9/2008 Harkness ........... H01L 31/0352
136/256
(Continued)

OTHER PUBLICATIONS

Al-Zeben, et al. "TLM modelling of diffusion, drift and recombination of charge carriers in semiconductors" *Int'l J. Num. Mod.: Elect. Net. Dev. Fields* 5 (1992) pp. 219-225.
(Continued)

*Primary Examiner* — Herve-Louis Y Assouman
*Assistant Examiner* — Christopher M Roland
(74) *Attorney, Agent, or Firm* — Dority & Manning, P.A.

(57) ABSTRACT

The present disclosure is directed to photovoltaic junctions and methods for producing the same. Embodiments of the disclosure may be incorporated in various devices for applications such as solar cells and light detectors and may demonstrate advantages compared to standard materials used for photovoltaic junctions such as silica. An example embodiment of the disclosure includes a photovoltaic junction, the junction including a light absorbing material, an electron acceptor for shuttling electrons, and a metallic contact. In general, embodiments of the disclosure as disclosed herein include photovoltaic junctions which provide absorption across one or more wavelengths in the range from about 200 nm to about 1000 nm, or from near IR (NIR) to ultra-violet (UV). Generally, these embodiments include a multi-layered light absorbing material that can be formed from quantum dots that are successively deposited on the surface of an electron acceptor (e.g., a semiconductor).

12 Claims, 7 Drawing Sheets

(51) Int. Cl.
        *H01L 31/108*        (2006.01)
        *H01L 31/0336*        (2006.01)
        *H01L 31/18*        (2006.01)
        *H01L 31/032*        (2006.01)
        *H01L 31/07*        (2012.01)
        *H01L 31/0304*        (2006.01)
        *H01L 31/0312*        (2006.01)
        *H01L 51/42*        (2006.01)

(52) U.S. Cl.
        CPC ...... *H01L 31/0324* (2013.01); *H01L 31/0336* (2013.01); *H01L 31/03048* (2013.01); *H01L 31/07* (2013.01); *H01L 31/108* (2013.01); *H01L 31/18* (2013.01); *H01L 31/1848* (2013.01); *H01L 51/42* (2013.01)

(56) References Cited

U.S. PATENT DOCUMENTS

| | | | | |
|---|---|---|---|---|
| 2010/0012168 | A1* | 1/2010 | Mihaila | H01L 31/0352 136/244 |
| 2011/0240106 | A1* | 10/2011 | Tang | H01L 31/0324 136/255 |
| 2011/0290310 | A1* | 12/2011 | Kuramachi | B82Y 20/00 136/255 |
| 2012/0223291 | A1* | 9/2012 | Klem | H01L 27/305 257/21 |
| 2014/0231766 | A1* | 8/2014 | Kim | H01L 51/5296 257/40 |
| 2018/0308998 | A1* | 10/2018 | Swelm | H01L 31/0296 |

OTHER PUBLICATIONS

Anghel, et al. "Low frequency noise in silicon carbide Schottky diodes" *Diam. Rel. Mater.* 6 (1997) pp. 1494-1496.
Atwater, et al. "Plasmonics for improved photovoltaic devices" *Nat. Mater.* 9 (2010) pp. 205-213.
Balachandran, et al. "4H-SiC homoepitaxy on nearly on-axis substrates using TFS-towards high quality epitaxial growth" *J. Cryst. Grow.* 448 (2016) pp. 97-104.
Balachandran, et al. "Study of SiC Epitaxial Growth Using Tetrafluorosilane and Dichlorosilane in Vertical Hotwall CVD Furnace" *Mater. Sci. For.* 821-823 (2015) pp. 137-140.
Balandin, A.A. "Low-frequency 1/f noise in graphene devices" *Nat. Nanotech.* 8 (2013) pp. 549-555.
Bao, et al. "Graphene Photonics, Plasmonics, and Broadband Optoelectronic Devices" *ACS Nano* 5 (2012) pp. 3677-3694.
Barker, Jr., et al. "Sub-bandgap response of graphene/SiC Schottky emitter bipolar phototransistor examined by scanning photocurrent microscopy" *2D Mater.* 5:11003 (2017) pp. 1-9.
Bessonov, et al. "Compound Quantum Dot-Perovskite Optical Absorbers on Graphene Enhancing Short-Wave Infrared Photodetection" *ACS Nano* 11 (2017) pp. 5547-5557.
Bonaccorso, et al. "Graphene Photonics and Optoelectronics" *Nat. Photo.* 4 (2010) pp. 611-622.
Carey, et al. "Colloidal Quantum Dot Solar Cells" *Chem. Rev.* 115 (2015) pp. 12732-12763.
Chava, et al. "High Detectivity Visible-Blind SiF4 Grown Epitaxial Graphene/SiC Schottky Contact Bipolar Phototransistor" *Appl. Phys. Lett.* 111:243504 (2017) pp. 1-5.
Chava, et al. "Evidence of Minority Carrier Injection Efficiency >90% in an Epitaxial Graphene/SiC Schottky Emitter Bipolar Junction Phototransistor for Ultraviolet Detection" *Appl. Phys. Lett.* 108:043502 (2016) pp. 1-5.
Chen, et al. "Biologically inspired graphene-chlorophyll phototransistors with high gain" *Carbon* 63 (2013) pp. 23-29.
Chen, et al. "Graphene-Silicon Schottky Diodes" *Nano Lett.* 11 (2011) pp. 1863-1867.

Cheung, et al. "Extraction of Schottky diode parameters from forward current-voltage characteristics" *Appl. Phys. Lett.* 49 (1986) pp. 85-87.
Choi, et al. "Photogenerated exciton dissociation in highly coupled lead salt nanocrystal assemblies" *Nano Lett.* 10 (2010) pp. 1805-1811.
Davydov, S.Y. "On the Electron Affinity of Silicon Carbide Polytypes" *Semiconductors* 41 (2007) pp. 696-698.
Davydov, et al. "Estimation of the Energy Characteristics of the 3C—SiC/2H—, 4H—, 6H—, and 8H—SiC Heterojunctions" *Semiconductors* 39 (2005) pp. 1391-1393.
Fan, et al. "Graphene/silicon nanowire Schottky junction for enhanced light harvesting" *ACS Appl. Mater. Interf.* 3 (2011) pp. 721-725.
Green, M.A. "Limiting efficiency of bulk and thin-film silicon solar cells in the presence of surface recombination" *Prog. Photovolt. Res. Appl.* 7 (1999) pp. 327-330.
Guglietta, et al. "Lifetime, Mobility, and Diffusion of Photoexcited Carriers in Ligand-Exchanged Lead Selenide Nanocrystal Films Measured by Time-Resolved Terahertz Spectroscopy" *ACS Nano* 9 (2015) pp. 1820-1828.
Guo, et al. "Layered graphene/quantum dots for photovoltaic devices" *Ange. Chemie* 49 (2010) pp. 3014-3017.
Henry, C.H. "Limiting efficiencies of ideal single and multiple energy gap terrestrial solar cells" *J. Appl. Phys.* 51 (1980) pp. 4494-4500.
Hooge, F.N. "1/f Noise Sources" *IEEE Trans. Electr. Dev.* 41 (1994) pp. 1926-1935.
Hwang, et al. "Ultrasensitive PbS Quantum-Dot-Sensitized InGaZnO Hybrid Photoinverter for near-Infrared Detection and Imaging with High Photogain" *NPG Asia Mater* 8:e233 (2016) pp. 1-9.
Kamat, P.V. "Graphene-based nanoassemblies for energy conversion" *J. Phys. Chem. Lett.* 2 (2011) pp. 242-251.
Kamat, P.V. "Graphene-based nanoarchitectures. Anchoring semiconductor and metal nanoparticles on a two-dimensional carbon support" *J. Phys. Chem. Lett.* 1 (2010) pp. 520-527.
Kelley, et al. "Photovoltaic and Photoconductive Action Due to PbS Quantum Dots on Graphene/SiC Schottky Diodes from NIR to UV" *ACS Appl. Electr. Mater.* 2 (2019) pp. 134-139.
Kirkwood, et al. "Enhancing Quantum Dot LED Efficiency by Tuning Electron Mobility in the ZnO Electron Transport Layer" *Adv. Mater. Interf.* 3:1600868 (2016) pp. 1-7.
Klem, et al. "Impact of dithiol treatment and air annealing on the conductivity, mobility, and hole density in PbS colloidal quantum dot solids" *Appl. Phys. Lett.* 92:212105 (2008) pp. 1-4.
Klem, et al. "Efficient solution-processed infrared photovoltaic cells: Planarized all-inorganic bulk heterojunction devices via inter-quantum-dot bridging during growth from solution" *Appl. Phys. Lett.* 90:183113 (2007) pp. 1-3.
Konstantatos, et al. "Hybrid Graphene-Quantum Dot Phototransistors with Ultrahigh Gain" *Nat. Nano* 7 (2012) pp. 363-368.
Konstantatos, et al. "PbS colloidal quantum dot photoconductive photodetectors: Transport, traps, and gain" *Appl. Phys. Lett.* 91 (2007) pp. 1-4.
Kroupa, et al. "Tuning colloidal quantum dot band edge positions through solution-phase surface chemistry modification" *Nat. Comm.* 8 (2017) pp. 1-8.
Leschkies, et al. "Photosensitization of ZnO nanowires with CdSe quantum dots for photovoltaic devices" *Nano Lett.* 7 (2007) pp. 1793-1798.
Li, et al. "The Graphene-Semiconductor Schottky Junction" *Phys. Tod.* 69 (2016) pp. 46-51.
Li, et al. "Graphene-on-silicon Schottky junction solar cells" *Adv. Mater.* 22 (2010) pp. 2743-2748.
Lin, et al. "100-GHz Transistors from Wafer-Scale Epitaxial Graphene" *Science* 327 (2010) pp. 662-662.
Liu, et al. "Scattering enhanced quantum dots based luminescent solar concentrators by silica microparticles" *Sol. Ener. Mater. Sol. Cells* 179 (2018) pp. 380-385.
Manga, et al. "High-Performance Broadband Photodetector Using Solution-Processible PbSe—$TiO_2$-Graphene Hybrids" *Adv. Mater.* 24 (2012) pp. 1697-1702.

(56) References Cited

OTHER PUBLICATIONS

Manga, et al. "High-Gain Graphene-Titanium Oxide Photoconductor Made from Inkjet Printable Ionic Solution" *Adv. Mater.* 22 (2010) pp. 5265-5270.
Mcdonald, et al. "Solution-processed PbS quantum dot infrared photodetectors and photovoltaics" *Nat. Mater.* 4 (2005) pp. 138-142.
Miao, et al. "High efficiency graphene solar cells by chemical doping" *Nano Lett.* 12 (2012) pp. 2745-2750.
Moreels, et al. "Size-dependent optical properties of colloidal PbS quantum dots" *ACS Nano* 3 (2009) pp. 3023-3030.
Nomani, et al. "Correlated Conductivity and Work Function Changes in Epitaxial Graphene" *Appl. Phys. Lett.* 100:092113 (2012).
Novoselov, et al. "Two-dimensional atomic crystals" *PNAS* 102 (2005) pp. 10451-10453.
Parand, et al. "Graphene/PbS as a Novel Counter Electrode for Quantum Dot Sensitized Solar Cells" *ACS Photonics* 14 (2014) pp. 323-330.
Pattantyus-Abraham, et al. "Depleted-heterojunction colloidal quantum dot solar cells" *ACS Nano* 4 (2010), pp. 3374-3380.
Piliego, et al. "5.2% Efficient PbS Nanocrystal Schottky Solar Cells" *Ener. Envir. Sci.* 6 (2013) pp. 3054-3059.
Rana, et al. "Epitaxial growth of graphene on SiC by Si selective etching using $SiF_4$ in an inert ambient" *Jap. J. Appl. Phys.* 54:030304 (2015).
Rana, et al. "Elimination of silicon gas phase nucleation using tetrafluorosilane ($SiF_4$) precursor for high quality thick silicon carbide (SiC) homoepitaxy" *Phys. Stat. Solidi A* 209 (2012) pp. 2455-2462.
Reina, et al. "Layer Area, Few-Layer Graphene Films on Arbitrary Substrates by Chemical Vapor Deposition" *Nano Lett.* 9 (2009) pp. 30-35.
Reshanov, et al. "Effect of an Intermediate Graphite Layer on the Electronic Properties of Metal/SiC Contacts" *Phys. Stat. Solidi B* 245 (2008) pp. 1369-1377.
Robin, et al. "Engineering the Charge Transfer in All 2D Graphene-Nanoplatelets Heterostructure Photodetectors" *Sci. Rep.* 6:24909 (2016) pp. 1-11.
Sablon, et al. "High-Response Hybrid Quantum Dots—2D Conductor Phototransistors: Recent Progress and Perspectives" *Nanophotonics* 6 (2017) pp. 1263-1280.
Saran, et al. "Lead Sulphide Nanocrystal Photodetector Technologies" *Nat. Photon.* 10 (2016) pp. 81-92.
Sargent, E.H. "Infrared photovoltaics made by solution processing" *Nat. Photon.* 3 (2009) pp. 325-331.
Shatalov, et al. "Lateral current crowding in deep UV light emitting diodes over sapphire substrates" *Jap. J. Appl. Phys.* 41 (2002) pp. 5083-5087.
Shen, et al. "Purification of quantum dots by gel permeation chromatography and the effect of excess ligands on shell growth and ligand exchange" *Chem. Mater.* 25 (2013) pp. 2838-2848.
Singh, et al. "Tunable Reverse-Biased Graphene/Silicon Heterojunction Schottky Diode Sensof" *Small* 10 (2014) pp. 1555-1565.
Sudarshan, et al. "Trade-Off between Parasitic Deposition and SiC Homoepitaxial Growth Rate Using Halogenated Si-Precursors" *ECS J. Sol. State Sci. Tech.* 2 (2013) pp. N3079-N3086.
Sun, et al. "Pseudohalide-Exchanged Quantum Dot Solids Achieve Record Quantum Efficiency in Infrared Photovoltaics" *Adv. Mater.* 29:1700749 (2017) pp. 1-5.
Sun, et al. "Infrared photodetectors based on CVD-grown graphene and PbS quantum dots with ultrahigh responsivity" *Adv. Mater.* 24 (2012) pp. 5878-5883.
Talapin, et al. "Prospects of Colloidal Nanocrystals for Electronic and Optoelectronic Applications" *Chem. Rev.* 110 (2010) pp. 389-458.
Weidman, et al. "Monodisperse, Air-Stable PbS Nanocrystals via Precursor Stoichiometry Control" *ACS Nano* 8 (2014) pp. 6363-6371.
Wiets, et al. "Electronic structure of SiC (0001) surfaces studied by two-photon photoemission" *Phys. Rev.* B 68:125321 (2003) pp. 1-11.
Xu, et al. "Photo-thermoelectric effect at a graphene interface junction" *Nano Lett.* 10 (2009) pp. 562-566.
Yang, et al. "Epitaxial Graphene/SiC Schottky Ultraviolet Photodiode with Orders of Magnitude Adjustability in Responsivity and Response Speed" *Appl. Phys. Lett.* 112:103501 (2018) pp. 1-4.
Yu, et al. "Graphene segregated on Ni surfaces and transferred to insulators" *Appl. Phys. Lett.* 93:113103 (2008) pp. 1-3.
Zaman, et al. "Evaluation of Correct Value of Richardson's Constant by Analyzing the Electrical Behavior of Three Different Diodes at Different Temperatures" *Mater. Sci. For.* 711 (2012) pp. 174-178.
Zarghami, et al. "P-Type PbSe and PbS Quantum Dot Solids Prepared with Short-Chain Acids and Diacids" *ACS Nano* 4 (2010) pp. 2475-2485.
Zhang, et al. "Synthetic conditions for high-accuracy size control of PbS quantum dots" *J. Phys. Chem. Lett.* 6 (2015) pp. 1830-1833.
Zhang, et al. "Understanding charge transfer at PbS-decorated graphene surfaces toward a tunable photosensor" *Adv. Mater.* 24 (2012) pp. 2715-2720.
Zhao, et al. "Improving the photovoltaic performance of cadmium sulfide quantum dots-sensitized solar cell by graphene/titania photoanode" *Electrochimica Acta* 96 (2013) pp. 110-116.
Zhitomirsky, et al. "Measuring Charge Carrier Diffusion in Coupled Colloidal Quantum Dot Solids" *ACS Nano* 7 (2013) pp. 5282-5290.

* cited by examiner

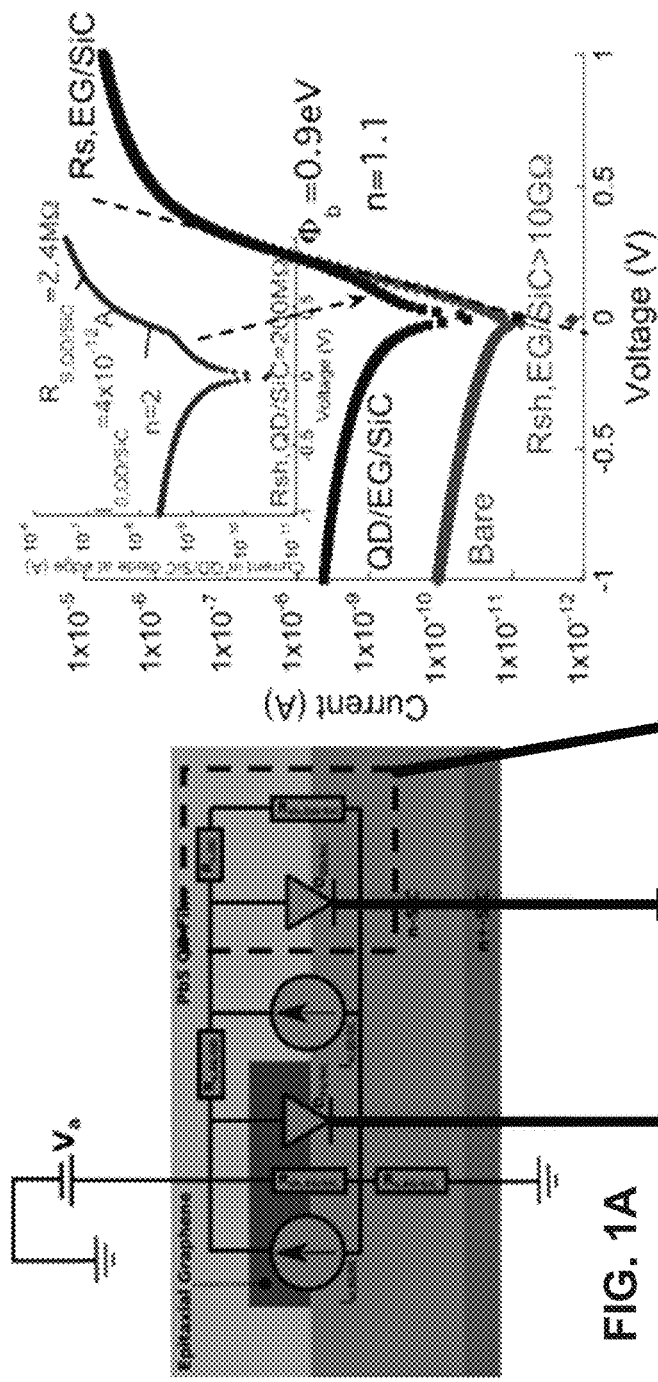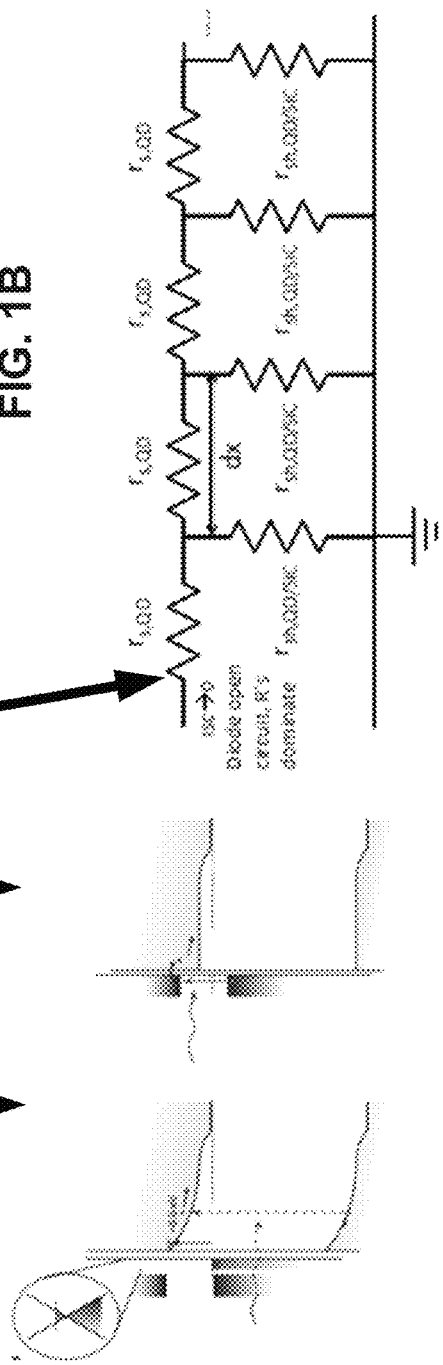
FIG. 1A
FIG. 1B
FIG. 1C
FIG. 1D oleic-acid 1,2-ethane dithiol

QUANTUM DOT PHOTOVOLTAIC JUNCTIONS

CROSS REFERENCE TO RELATED APPLICATIONS

The present Application claims priority to U.S. Provisional Patent Application No. 62/866,857, having the filing date Jun. 26, 2019, which is incorporated herein by reference in its entirety.

STATEMENT AS TO RIGHTS TO INVENTIONS MADE UNDER FEDERALLY SPONSORED RESEARCH

This invention was made with Government support under Contract Nos. 1810116 and 1711322, awarded by the National Science Foundation (NSF), and Contract No. DGE1250052, awarded by the NSF Integrative Graduate Education and Research Traineeship (NSF IGERT) program. The Government has certain rights in the invention.

BACKGROUND

Quantum dots (QDs) are low-dimensional solid structures that can be made from metals, insulators, or semiconductors. Due to the quantum confinement of carriers inside these small structures, <10 nm, the emergent electronic properties are significantly different from the bulk material, as well as from those of constituent atoms. In other words, QDs are a distinct class of solid materials with size-tunable electronic/optical properties in a platform compatible with traditional solid-state technologies. Metallic QDs (e.g., Au, Ag) have been used for size-tunable color staining in glasses and drug-delivery, while insulator QDs (e.g., silica, diamond) have been used in other applications ranging from chemical mechanical polishing and biomedicine.

Semiconductor QDs, such as those composed of led sulfide (PbS), notably demonstrate size-tunable luminescence and optical absorption over the entire UV-vis-IR spectrum and have, therefore, been proposed for solar cells, optical sensors, and light-emitting diodes. Recently, PbS QDs have been incorporated into solar cells of several designs, including those analogous to dye-sensitized solar cells (using QDs in place of dye) and to planar and bulk heterojunction thin film solar cells, where assemblies of close-packed QDs placed between two planar electrodes behave as semiconducting solids. The demonstration of >10% efficiency in QD solar cells showed the promise of this approach. On the commercial front, the incorporation of QDs into light emitters has led to displays, showing that the technology is viable. The key manufacturing advantage of QDs over traditional semiconductor and thin-film technology is the possibility of large-scale solution-based manufacturing. This allows large volumes to be produced compared to other thin-film technologies, leading to much lower costs. However, careful process control is required to fully exploit the properties of QDs. Due to the strong size dependence of properties, a key feature of QDs, small variations in dimensional control, and surface termination during the synthesis can have large effects in the output performance of devices made from them. In recognition of this, significant efforts have been expended over the last decade in i) tight size distribution of QD dimension, leading to narrow luminescence linewidths; ii) purity of QDs due to contamination from precursors; and iii) termination of the surface for work-function engineering using ligand exchange chemistries. Armed with this synthetic toolbox, it is now possible to engineer QD-based optoelectronic devices in a rational way.

The integration of QDs with other low-dimensional hybrid structures—graphene especially—has been explored due to the potential for bulk nanostructured materials with new emergent properties. Optical responsivity ~$10^8$ A/W was observed in a graphene/QD photodetector. However, structures and methods for forming the same that demonstrate features such as improved manufacturability, while maintaining effective optoelectronic properties, are still needed in the art.

SUMMARY OF THE INVENTION

The present disclosure is directed to photovoltaic junctions and methods for producing the same. Embodiments of the disclosure may be incorporated in various devices for applications, such as solar cells and light detectors, and may demonstrate advantages compared to standard materials used for photovoltaic junctions, such as silica. An example embodiment of the disclosure includes a photovoltaic junction, the junction including: a light absorbing material; an electron acceptor (e.g., a semiconductor) for shuttling electrons; and a metallic contact. In general, embodiments of the disclosure as disclosed herein include photovoltaic junctions, which provide absorption across one or more wavelengths in the range from about 200 nm to about 2000 nm, or from near IR (NIR) to ultra-violet (UV).

An example aspect of the disclosure includes embodiments where the light absorbing material can include a layer of quantum dots that can absorb wavelengths across a broad range of about 180 to about 800 nm, such as about 200 to about 750, about 220 to about 700, or about 250 to about 650 nm.

Another example aspect of the disclosure includes embodiments where the electron acceptor includes a semiconductor having a bandgap greater than that of the light absorbing material. Generally, the bandgap of a material may be determined using techniques known in the art or with reference to experimentally validated data.

Another example aspect of the disclosure includes embodiments where the metallic contact acts as a hole collector (e.g., such that electric current flows from the device through this contact when the device is illuminated at short circuit). Example metallic contacts need not necessarily include a metal and may also include forms of carbon such as graphite, graphene, or related materials.

BRIEF DESCRIPTION OF THE DRAWINGS

A full and enabling disclosure of the present invention, including the best mode thereof to one skilled in the art, is set forth more particularly in the remainder of the specification, which includes reference to the accompanying Figures.

FIGS. 1A-1D illustrate representations of photovoltaic systems in accordance with example embodiments of the disclosure.

Figure 2A:
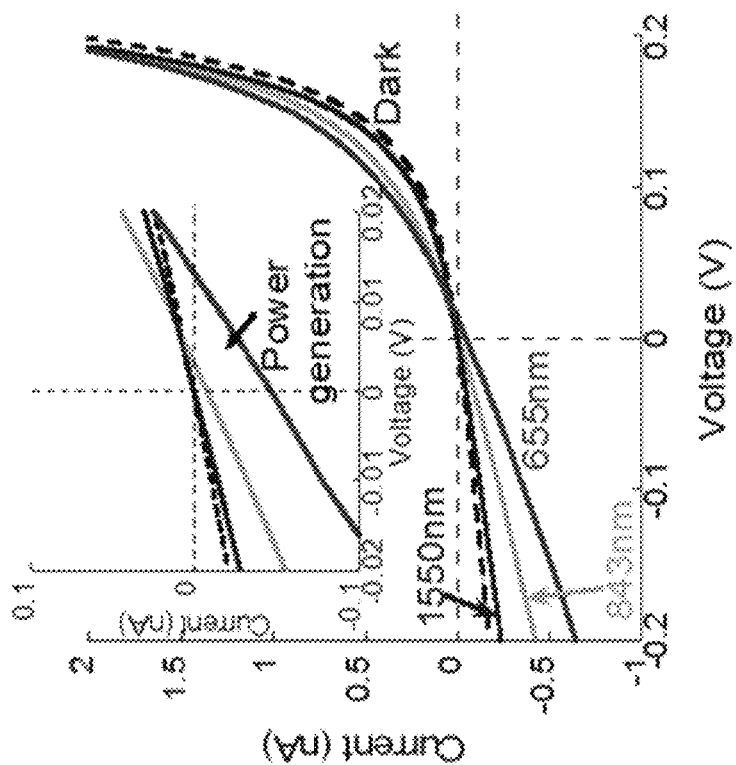
FIGS. 2A-2C illustrate aspects of example photovoltaic systems in accordance with example embodiments of the disclosure.

Repeat use of reference characters in the present specification and drawings is intended to represent the same or analogous features or elements of the present invention.

DETAILED DESCRIPTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only and is not intended as limiting the broader aspects of the present invention, which broader aspects are embodied exemplary constructions.

Generally speaking, the present invention is directed to photovoltaic junctions, devices incorporating photovoltaic junctions, and methods for forming the photovoltaic junctions. For instance, a photovoltaic junction as disclosed herein can include a light absorbing material, an electron acceptor for shuttling electrons, and a metallic contact. In certain implementations, the photovoltaic junction may provide broad-spectrum absorption across a range of wavelengths from about 200 nm to about 800 nm. As an example, a broad-spectrum photovoltaic junction may include a light absorbing material that includes one or more quantum dots that are dispersed as a film or coating on the electron acceptor material. The electron acceptor can be manufactured from one or a combination of materials, but in general, the electron acceptor should have a slightly larger bandgap (e.g., greater than 1 eV) with respect to the light absorber. The electron acceptor and/or the light absorber can be in contact with a metallic contact for conducting electricity generated by the photovoltaic junction.

For embodiments of the disclosure, the light absorbing material can include one or more quantum dots. The quantum dots may include only a single element (e.g., Si, Ge, Te) or multiple elements (e.g., PbS), and the size of the quantum dot may range from about 0.5 nm to about 20 nm. In an example implementation, the light absorbing material can include a plurality of lead sulfide (PbS) quantum dots distributed as a layer on the photovoltaic junction. In general, the quantum dots can be deposited onto a substrate to create one or more layers that, in combination, comprise the light absorbing material.

In some embodiments, the light absorbing material may include a surface ligand attached to the quantum dots. The surface ligands can include organic molecules that can bind either covalently or non-covalently to the surface of the quantum dotes. As an example, the surface ligand can include singly functionalized molecules (e.g., oleic acid) that include a functional group such as a carboxylate (—COO), an amine (—NH$_2$), or a thiol (—SH) group. In some implementations, the surface ligand can include multi-functional molecules (e.g., 1,2-ethane dithol) that contain two or more functional groups. By adjusting the functional group and/or an aspect of the organic molecule (e.g., alkyl chain length), properties of the light absorbing material, including physical properties such as thickness, may be adjusted. For example, longer alkyl chains, such as are present in oleic acid, may decrease efficiency in electron transport. Additionally, the use of multi-functional molecules can produce cross-linking between quantum dots that may improve the mechanical stability of the light absorbing material. For embodiments disclosed herein, different ligands can be used either alone or in combination to produce photovoltaic junctions in accordance with the disclosure.

For embodiments of the disclosure, the light absorbing material can be described by a film thickness which characterizes the thickness of the light absorbing material in contact with the electron acceptor. In certain embodiments, the film thickness can be between about 50 nm to about 500 nm, such as about 100 nm to about 400 nm, or about 150 nm to about 300 nm.

In embodiments of the disclosure, the electron acceptor can include a semiconductor. Generally, the semiconductor may be characterized as having a bandgap greater than the bandgap of the light absorbing material. According to the disclosure, example electron acceptor materials can include nitrides (e.g., InGaN), carbides (e.g., SiC), or other semiconductor materials.

In embodiments of the disclosure, the metallic contact can include an electron conducting material having a resistance (e.g., a sheet resistance) of less than about 1000 ohms, such as about 5 to about 950, about 10 to about 900, or about 50 to about 800 ohms. Example electron conducting materials can include, but are not limited to, oxides (e.g., TiO$_2$), metals (e.g., Cu), and/or 2-dimensional conductors (e.g., graphene).

One aspect of the photovoltaic junctions produced according to the disclosure can include a junction arrangement, which describes the physical contact between the light absorbing material, the electron acceptor, and/or the metallic contact. In certain embodiments, the light absorbing material can be in contact with only the electron acceptor or only the metallic contact. Alternatively, for some embodiments, the light absorbing material can be in contact with both the electron acceptor and the metallic contact. In certain embodiments, the electron acceptor can be in contact with only the metallic contact. Further, in certain embodiments, the electron acceptor can be in contact with the light absorbing material and the metallic contact, and the light absorbing material can be in contact with the metallic contact. As an example orientation, a photovoltaic junction produced according to the disclosure may be formed in layers, such as a junction having a first layer including the electron acceptor, a second layer including the metallic contact in physical contact with the first layer, and a third layer including the light-absorbing material in physical contact with both the first and the second layer.

Another example junction arrangement, in accordance with the disclosure, can include a substantially homogeneous composition formed from a mixture containing the light absorbing material, the electron acceptor, and the metallic contact. The mixture can be in the form of a powder or solution that, upon applying heat or another energy source, produces a substantially homogenous composition where the electron acceptor, the metallic contact, and the light absorbing material are all in physical contact. Several possible advantages may be derived from this arrangement, such as improving the ease and/or cost of manufacture.

One aspect of photovoltaic junctions according to the present disclosure can include a physical junction between the light absorbing material and the metallic contact. This physical junction may be electrically transparent (e.g., an ohmic contact) such that the junction does not necessarily need to act as a photovoltaic junction at all times.

Another aspect of photovoltaic junctions disclosed herein can include a physical junction between the metallic contact and the electron acceptor. In general, this physical junction may exhibit negligible conductivity during normal modes of use so that the presence of such physical junction does not significantly impact use and/or efficiency of the device.

Another example embodiment of the disclosure includes a method for producing a photovoltaic junction. Generally, methods for producing a photovoltaic junction can include coating a bare junction with a composition—the composition including a plurality of quantum dots—to create a film, exposing the film to a ligand to create a first layer; coating the first layer with the composition to form a film on the first layer; and exposing the film on the first layer to the ligand to create a second layer.

Aspects of the bare junction can include materials made from an electron acceptor and a metallic contact as defined herein. The electron acceptor can be in the form of a single crystal material that may be obtained through a growth-nucleation process or may be purchased commercially. Additionally, the metallic contact may be present on the electron acceptor, may be grown on the electron acceptor as a thin film, or may be combined with the electron acceptor as a mixture (e.g., a powder) that may undergo additional processing to form the bare junction or to directly form the photovoltaic junction.

Techniques for forming a coating on the bare junction can include spin coating, painting, or other suitable methods for producing a film of material on a surface.

In certain implementations, the bare junction may include one or more semi-conductors such as the electron acceptor materials disclosed herein. It should be understood that semi-conductors can include a wide range of materials and that embodiments of the disclosure are not solely limited to the semi-conductors disclosed herein.

For some implementations, the method for producing a photovoltaic junction may further include depositing one or more additional (i.e., new) layers. For example, in certain implementations, the method can also include coating the previous layer (e.g., the first layer, second layer, etc.) with a composition, including the quantum dots, to form a film and exposing the film to ligand to produce a new layer (the new layer in contact with the previous layer). In certain embodiments, this can be repeated 1-98 times to produce 1-98 new layers.

An example advantage of methods and devices disclosed herein includes improved manufacturability due, at least in part, to the different arrangements that can be used with photovoltaic devices of the disclosure. For instance, another example method for producing a photovoltaic junction can include obtaining a mixture of a light absorbing material, an electron acceptor, and a metallic contact. Example mixtures can include powdered forms of the light absorbing material, the electron acceptor, and the metallic contact. The mixture can then be activated by applying an energy source to heat the electron acceptor and/or the metallic contact above the metaling temperature of the material. In this manner, methods for forming the bare junction or photovoltaic junctions, as disclosed herein, may be combined with manufacturing technology, such as 3-D printers, to design thin film photovoltaic junctions or photovoltaic junctions having a complex structure for use in applications such as light emitting diodes or solar panels.

Figure 6:
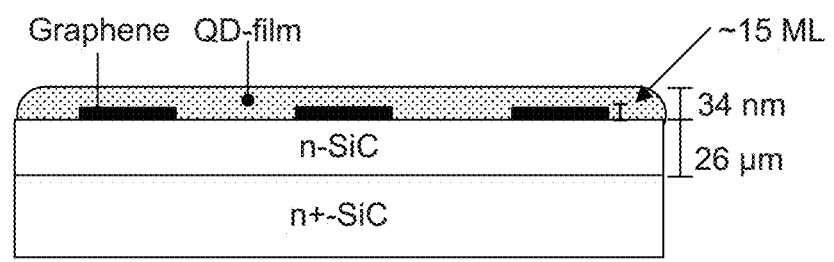
FIG. 6 illustrates an image of an example photovoltaic junction in accordance with example embodiments of the present disclosure.

Alternatively, certain embodiments can be manufactured as separate layers having one or more contact regions between different components of the photovoltaic junction. For instance, FIG. 6 illustrates one example embodiment of a photovoltaic junction. The photovoltaic junction can include one or more electron acceptor layers such as a semi-conductor (e.g., n– doped silicon carbide). Further, the doping for the semi-conductor can be varied to produce n+ doped semiconductors that can behave as degenerate materials and display conductivity comparable to metals. In contact with the electron acceptor, one or more metallic contacts (e.g., graphene) can be deposited as one or more monolayers. For instance, in the illustration about 15 monolayers (ML) of graphene are illustrated, though the number can range from about 1 ML to about 100 ML, such as about 5 ML to about 90 ML, about 8 ML to about 80 mL, about 10 ML to about 70 ML, about 15 ML to about 50 ML, or any values (e.g., 12 ML, 42 ML, 95 ML, etc.) within these ranges.

Additionally, in contact with both the electron acceptor and the metallic contacts is a light absorbing material (e.g., a quantum dot film). The quantum dot film can substantially cover the entirety of the electron conductor surface, such that any incident light must pass through the light absorbing material before reaching the electron acceptor. Further, the photovoltaic junction may be manufactured as a sheet, having one or more dimensions that are substantially greater than a third dimension. For instance, the thickness of the light absorbing material can be at least an order of magnitude (about ten-fold) smaller than the length and/or the width of the layer creating a rectangular prism. This structure can provide a larger surface area for light capture, while limiting loss due to scattering or other inefficiencies as electromagnetic radiation contacts the photovoltaic junction. For instance, while exemplified in FIG. 6 as 34 nm, it should be understood that the thickness of the light absorbing material can range from about 8 nm to about 400 nm such as about 10 nm to about 300 nm, about 15 nm to about 200 nm, about 20 nm to about 100 nm, about 25 nm to about 50 nm, or any values within these ranges.

Another aspect of example photovoltaic junction can include a thickness of the electron acceptor. As illustrated, the electron acceptor thickness is generally greater than the thickness of the light absorbing materials. For instance, while exemplified in FIG. 6 as 26 μm, it should be understood that the collective electron acceptor thickness (e.g., of all layers together) can range from about 5 μm to about 200 μm, such as about 10 μm to about 180 μm, about 20 μm to about 160 μm, about 25 μm to about 140 μm, about 30 μm to about 120 μm, about 50 μm to about 100 μm, or any values within these ranges.

Example 1

Example 1 discusses various methods and procedures and provides exemplary embodiments that may be understood in conjunction with the Drawings and Description provided herein.

Methods

Diode Formation

The epitaxial graphene (EG) and silicon carbide (SiC) Schottky diodes were created by first growing a homoepitaxial layer of n-type 4H-SiC, unintentionally doped $N_d=1.6\times10^{14}$ cm$^{-3}$ on a $-n^+$-SiC substrate by chemical vapor deposition (CVD) in a hot wall reactor using SiF$_4$ and propane precursors in a hydrogen ambient as described elsewhere. The doping of the active layer was determined from a mercury probe capacitance-voltage measurement and the thickness of the 26 nm n-type active SiC layer was determined from Fourier transform infrared reflectance (FTIR). The EG Schottky contacts were then grown natively on this previous homoepitaxial layer, also using SiF$_4$ in an Ar ambient, preventing the etching of carbon that would occur in a hydrogen ambient. All growths were carried out at 1600° C. EG showed the key Raman peaks: the intrinsic G-peak at ~1580 cm$^{-1}$, the disorder induced D-peak at ~1350 cm$^{-1}$, and the second order 2D peak at ~2650 cm$^{-1}$. The D/G ratio was ~0.1, indicating good quality. The thickness was determined from X-ray photoelectron spectroscopy to be ~15 monolayers. Individual device mesas were fabricated using standard photolithography with O$_2$-plasma reactive ion etching to pattern the EG.

Quantum Dot Formation

PbS QDs were synthesized following the method outlined by Zhang et al ("Synthetic conditions for high-accuracy size control of PbS quantum dots" *J. Phys. Chem. Lett.* 6 (2015) pp. 1830-1833). The QDs were found to have a diameter of 4.5 nm based on the lowest energy exciton peak position found to be at 1280 nm from UV-vis absorption spectroscopy. Following synthesis, the QDs were initially protected by alkyl carboxylate surface coating (ligand) and were then purified by gel permeation chromatography. A thin film was formed on the bare Schottky device by spin-coating followed by in situ ligand-exchange with ethanedithiol. The resulting film had a thickness of about 34 nm based on the absorbance of a comparable film. The QD film could be removed using hydrofluoric acid, restoring the EG/SiC Schottky diode to its original state, and it was found that re-spinning a new QD film produced the same results. The cleaning and re-spinning process was tested four times with reproducible results.

Current-Voltage Measurement Quantum Dot Formation

Current-voltage (I-V) measurements were conducted with the device configured as shown in FIG. 1 in the dark, and under monochromatic light from 250-700 nm provided by a Xenon light source, with a slit width of 5 nm. The optical power intensity at each wavelength was calibrated with a commercial Si photodiode. The transient and noise measurements were conducted with the same configuration, having the ground current routed through a trans-impedance pre-amplifier to convert the current to a voltage to be read on an oscilloscope. Noise spectra were obtained by taking the Fourier transform of the current trace.

Scanning Photocurrent Microscopy

Current Scanning photocurrent microscopy (SPCM) was used to spatially map the photocurrent, and charge collection in the device. This was done with a 444 nm laser chopped at 113 Hz to illuminate the sample. The resultant photocurrent was recorded with a lock-in amplifier referenced to the chopper and mapped across the device surface with an estimated spot size, and spatial resolution ~2 µm. Further details on the SPCM setup can be found in previous work.

Results

Results provided in the drawings and described herein are meant to be exemplary and are not intended to limit the methods and compositions to modifications or alternatives as would be understood by a person of ordinary skill in the field of endeavor.

The bare EG/SiC Schottky diodes were rectifying (FIG. 2A), and behaved in accordance with thermionic emission in forward bias, $$I = AA^*T^2\exp\left(-\frac{\Phi_b}{kT}\right)\left[\exp\left(\frac{qV}{nkT}\right)-1\right] = I_0\left[\exp\left(\frac{qV}{nkT}\right)-1\right] \quad \text{Eq. 1}$$

giving a Schottky barrier height $\Phi_b$~0.9 eV and an ideality n~1.1. Upon addition of the QD-film, the QD/EG/SiC diodes demonstrated significantly higher reverse leakage ~$10^2$ more than without QDs, suggesting the presence of trap states increasing leakage. Such traps are responsible for "soft-breakdown" in diodes, where the increasing leakage with voltage indicates a field-activated transport mechanism, indicating the presence of a second parallel barrier interface through which <0.2 V current is flowing. This observation was associated with the QD-film interface at the diode periphery (FIGS. 1A-1D). Upon removal with HF, this feature disappeared, and the reverse leakage reverted to the bare state, indicating the changes were due to the QD-film. It should be noted that despite the possibility that QD adsorption on graphene could affect its work function due to impurity molecules during QD-film formation, significant change in the 0.9 eV EG/SiC barrier height (FIG. 1B) was not observed. The 15 ML-thick EG layer screens out significant changes at the QD/EG surface from the EG/SiC Schottky junction due to graphene's 1 ML screening length.

To obtain the effective I-V of the parallel current, the bare EG/SiC current was subtracted from the QD/EG/SiC current (FIG. 1B inset). The result was the additional QD/SiC diode that emerged at the edge of the device (FIG. 1A). This parallel diode had a series resistance $R_{s,QD}$=2.4 MO attributed to the spreading resistance through the QD-film, a shunt resistance $R_{sh,QD/SiC}$~160 MΩ attributed to trapping at the QD/SiC interface and a diode element with $I_{0,QD/SiC}$=4 pA, and an ideality n=2 (obtained by subtracting the $R_{s,QD}$ voltage drop). This indicates that the QD/SiC diode exhibits Shockley-Read Hall (SRH) trap-assisted recombination, in stark contrast with the n~1 ideal behavior from the majority carrier EG/SiC diode. At diode voltage <0.2 V, $R_{sh,QD/SiC}$ dominates the current and is likely due to a field-activated trapping mechanism at the QD/SiC interface, such as Poole-Frenkel emission. Given that both PbS-QDs and SiC are photosensitive, it is expected that both the QD/SiC diode, as well as $R_{sh,QD/SiC}$, will respond under illumination, increasing the current flow.

Upon illumination of the bare EG/SiC diodes with monochromatic light, above 4H-SiC bandgap (3.2 eV, λ<380 nm) photocurrent is seen (FIG. 2A), consistent with a classic photovoltaic effect, giving an open circuit voltage ($V_{OC}$) of ~0.25 V. This is also in agreement with the barrier height measured from the forward I-V curves, $$V_{OC} = \frac{nkT}{q}\ln\left(\frac{I_{SC}}{I_0}+1\right) \quad \text{Eq. 2}$$

at these low short circuit currents $I_{SC}$~1-2 nA depending on wavelength. With the addition of the QD-film, $V_{OC}$ and $I_{SC}$ both decrease, indicating the reduction of above bandgap light intensity by the QD-film, preventing the same of intensity light from creating electron-hole pairs in the SiC. While $I_{SC}$ is similar, $V_{OC}$ is reduced significantly to <0.1 V. The emergence of $R_{sh,QD/SiC}$ at the device edge (FIGS. 1A-1D) is responsible for reducing $V_{OC}$. In the region where photocurrent is less than 5 nA, before either the EG/SiC or QD/SiC diode has turned on, any voltage drops across the series resistors can be neglected. All current flows through $R_{sh,QD/SiC}$ and $V_{OC}$ can be approximated from (FIGS. 1A-1D).

$$V_{OC} \approx I_{SC} R_{sh,QD/SiC} \qquad \text{Eq. 3}$$

Equation (3) produces a value in reasonable agreement with the measured $V_{OC} \sim 0.1$ V, at $I_{SC} = 1$ nA. Upon reverse-biasing, the QD/EG/SiC dark current, $I_{dark}$, as well as photocurrent ($I_{ph} = I(\lambda) - I_{dark}$), increase monotonically with voltage. The increasing $I_{ph}$ with voltage in QD/EG/SiC indicates the presence of carrier traps, leading to photoconductive gain, increasing photocurrent. This effect is physically accounted for in FIG. 1A, where $R_{sh,QD/SiC}$ allows increasing current with increasing reverse bias. $R_{sh,QD/SiC}$ also decreases by ~1.5-2× under illumination due to photogenerated carriers across all wavelengths. The presence of trapping effects is further supported by the emergence of Lorentzian $1/f^2$ noise compared to $1/f$ flicker noise for the bare EG/SiC (FIG. 1D inset). The $1/f^2$ Lorentzian noise is a clear indicator of sharp, well-defined trap levels that cause noise from variations in carrier concentration due to trapping/detrapping and trapping phenomena have been observed in QD films by others. The possibility of avalanche gain may be tentatively excluded considering the voltages and doping levels are small, less than 1 V and less than $10^{15}$ cm$^{-3}$ respectively, giving low electric fields $\sim 10^4$ V/cm. Moreover, avalanche processes typically have much sharper voltage dependence.

Illumination with sub-bandgap light from a monochromator 380 nm<$\lambda$<700 nm showed similar I-V behavior compared to above-bandgap light but with a much smaller $I_{ph}$ due to the weak absorption in the thin QD-film compared to what is essentially complete absorption in the thick SiC epitaxial layer for above-bandgap light. $R_{s,QD/SIC}$ decreased under illumination at all wavelengths, indicating that photoabsorption is occurring in the QD-film.

To test the applicability of this model beyond the visible, 700 nm<$\lambda$<1280 nm (absorption edge of PbS QDs) 3 LEDs were used with $\lambda$=655 nm, 843 nm, and 1550 nm adjusted so ~180 nW of incident power falls within the EG mesa. FIG. 2B shows the measured $I_{SC}$ were 50, 15, and 0 pA, respectively, showing that the photoresponse cuts off below the absorption energy of the PbS QDs. In all of these measurements, the observed $V_{OC}$ was in complete accordance with Equation (3), showing the general applicability of the circuit model (FIGS. 1A-1D) from ~250-1550 nm. It should be noted that there is a small change in $R_{sh,QD/SiC}$ at 1550 nm, which was attributed to the tail of a broad 1550 nm peak that overlaps with the absorption edge of the QDs at 1280 nm.

Removal of the QD-film with HF eliminates the sub-bandgap photovoltaic effect. The possibility of a second-order artifact from the UV tail in the monochromated light source was precluded by performing measurements with a 550 nm long-pass filter. Dividing $I_{ph}$ ($V_a = -1$ V) by the measured power incident on the device, the responsivity, $R(\lambda)$, was extracted as a function of wavelength (FIG. 2C). An expected, increase in $R(\lambda)$ was observed starting near the bandgap of 4H-SiC. There is a clear increase in $R(\lambda)$ for the QD/EG/SiC diodes biased at $-1$ V due to photoconductive gain at reverse bias at all measured wavelengths when compared to the bare EG/SiC devices.

Figure 2B:
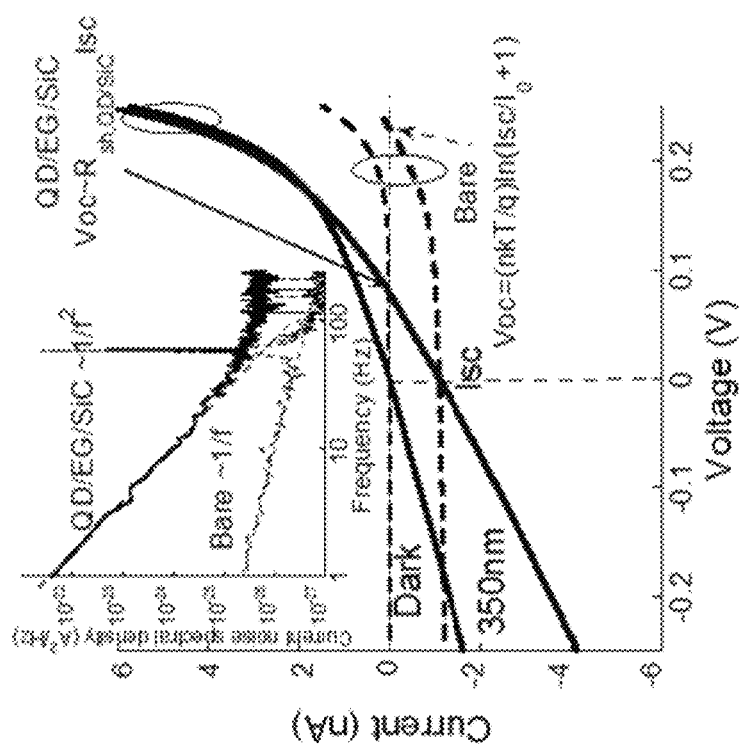
Figure 2C:
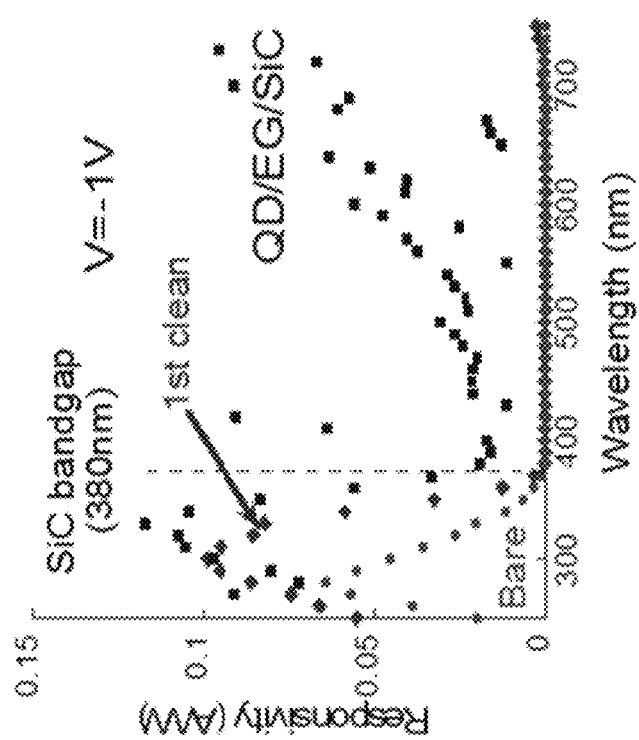
Figure 3B:
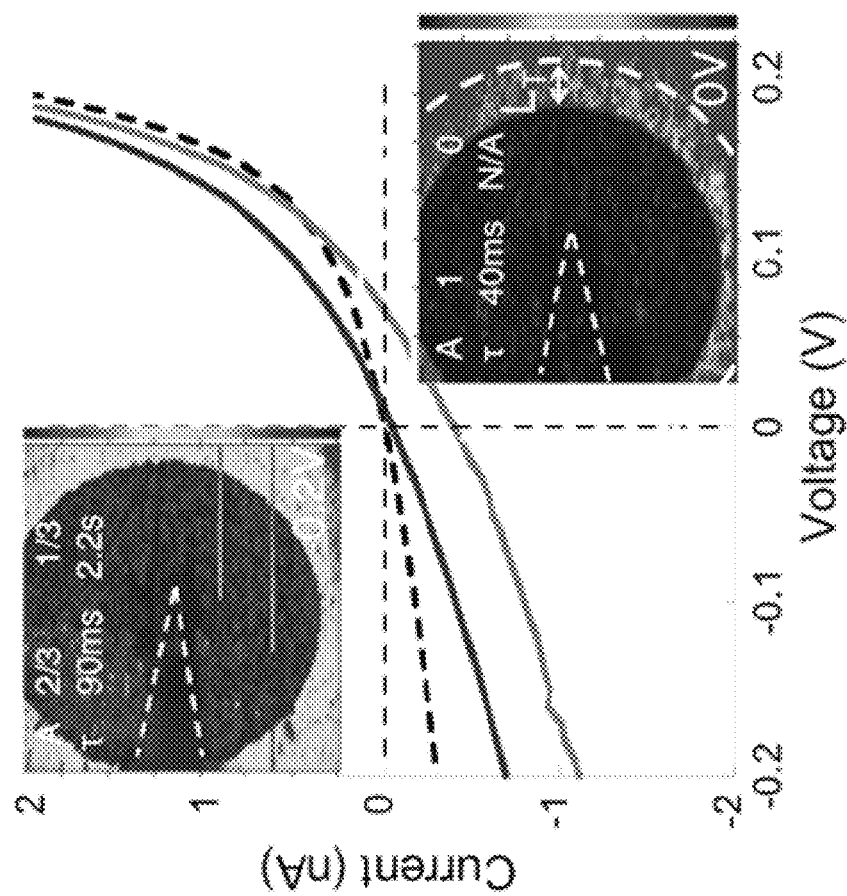
FIGS. 3A and 3B illustrate images and graphs displaying aspects of example photovoltaic systems in accordance with example embodiments of the disclosure.
Figure 3A:
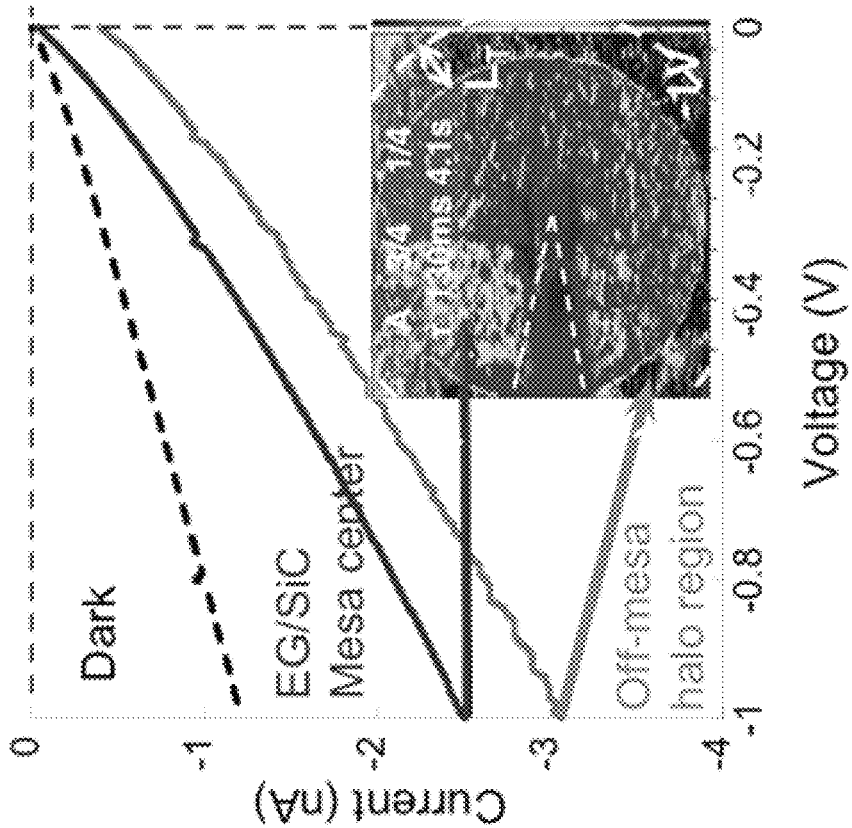

The assertion that photoconductive gain occurs at the QD/SiC diode around the EG mesa periphery is clearly seen in the SPCM maps of FIGS. 3A-3B. There is a sharp increase in $I_{ph}$ near the periphery that is higher than that measured within the QD/EG/SiC mesa, extending radially ~30 µm. Studies have previously reported on SPCM maps of EG/SiC devices, where $I_{ph}$ is confined to the EG mesas, and the photoresponse is entirely determined by the SiC bandgap. The current spreading from the edge of the EG mesa into the QD film is directly extracted from the area of the halo in the SPCM maps (FIGS. 3A-3B) and decays to half its value over ~80 µm regardless of reverse bias over the range of our measurements. This constitutes a transfer length $L_T$, which describes exponential decay with distance in terms of a transmission line model (TLM) derived from the circuit model in FIGS. 1A-1D. Here, the currents were assumed to be low enough that $R_{sh,QD/SiC}$ and $R_{s,QD}$ dominate the behavior, meaning the diodes have not turned on in reverse bias, which is reasonable given that this can be seen in the measured I-V curves in FIGS. 1A-1D and 2A-2C. The equivalent TLM circuit is shown in FIG. 1D, giving the following expression for $L_T$:

$$L_T = \sqrt{\rho_{sh,QD/SiC}(t_{QD}/\rho_{s,QD})} \qquad \text{Eq. 4}$$

where $t_{QD}$ is the thickness of the QD film, $\rho_{s,QD}$ is the (3D) resistivity of the QD film, and $\rho_{sh,QD/SiC}$ is a specific interface resistance at the QD/SiC interface, defined such that $R_{sh,QD/SiC} = R_{sh,QD/SiC}/A_{QD/SiC}$, with $A_{QD/SiC}$ the effective interface area. The SPCM maps give $L_T \sim 115$ µm near $V_a = 0$ V. To approximate the effective interface area, we consider a ring of width $L_T$ surrounding the mesa of radius r so that $A_{QD/SiC} = 2\pi r L_T + \pi L_T^2$. Using $R_{sh,QD/SiC} = 200$ MΩ as seen in FIG. 1B, $R_{s,QD/SiC} \sim 260$ kΩcm$^2$. From absorbance measurements, $t_{QD} = 34$ nm (see SI). Solving Eq. 4 for $R_{s,QD}$ gives $\rho_{s,QD} \approx 7$ kΩ-cm.

The increase in $I_{ph}$ with larger reverse voltage shown in FIGS. 2A-2C and 3A-3B was attributed to photoconductive gain in the QD/SiC diode. Transient measurements performed over large area show that the increased $I_{ph}$ with voltage comes with a tradeoff of slower response time. This is shown in the 444 nm light-off photocurrent transient response times (FIGS. 3A-3B) increasing from ~40~130 ms, while $I_{ph}$ increased by ~3×, in proportion to the response time. This is the clear signature of photoconductive gain. A second, lower amplitude transient with slower time constant also emerges.

Referring now to FIGS. 1A-1D, these figures illustrate (1A) equivalent circuit representation of the EG/SiC and QD/EG/SiC device interfaces indicating the spreading resistance of the QD-film and shunt resistance of the QD/SiC interface; (1B) The dark I-V characteristics for the bare, hybrid, and subtracted QD-film (inset); (1C) Energy band diagrams of the constituent diodes shown in (1A); and (1D) Transmission line model (TLM) representation of QD/SiC diode as $I_{SC} \to 0$, where all the diode elements are off, leaving only the resistor components. This TLM model represents current transfer from the QD-film into the SiC semiconductor.

Referring now to FIGS. 2A-2C, these figures illustrate (2A) the dark and 350 nm illuminated I-V curves for the bare EG/SiC and hybrid QD-film devices, (inset) the dark current noise spectral density (A$^2$/Hz) for both the bare and hybrid QD-film devices with linear and quadratic curve fits; (2B) The dark and illuminated I-V curves for the hybrid QD-film device at 1550, 843, and 655 nm with illumination powers corresponding to 175, 171, and 193 nW respectively, (inset) higher resolution plot of the power generating region of the hybrid device under the same conditions; and (2C) Responsivity plot for the bare, cleaned, and hybrid QD-film device biased at −1 V from 250-750 nm.

Referring now to FIGS. 3A and 3B, these figures illustrate SPCM maps at 15 W and 444 nm for QD-film/EG/SiC device biased from −1 V to 0 V, along with ON→OFF transient response performance shown below for similar 444 nm illumination power over a large area ~1 cm². The photocurrent, $I_{ph}$, increased with larger voltage, at the expense of slower response time, indicative of photoconductive gain emerging along with a slower time constant. The SPCM maps were scaled by using DC spot measurements in the middle of the device, and at the halo. The $I_{ph}$ decay at the edge of the device is linear with distance, supporting the spreading resistance of the QD-film shown in FIG. 1. The maximum $I_{ph}$ for all the scales is 1800 pA.

Figure 4A:
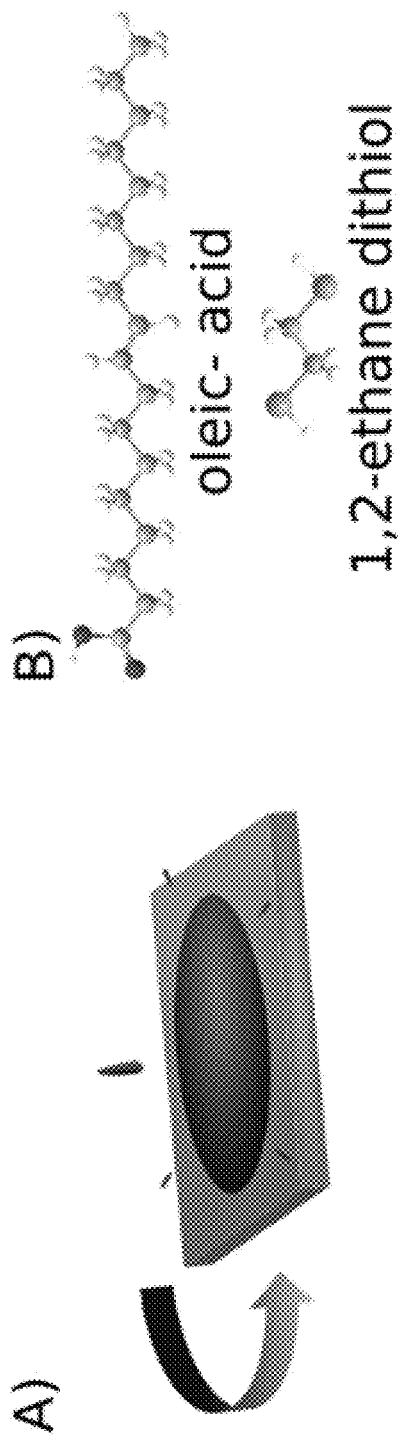
FIGS. 4A-4C illustrate images displaying example methods for producing photovoltaic systems in accordance with example embodiments of the disclosure.
Figure 4B:
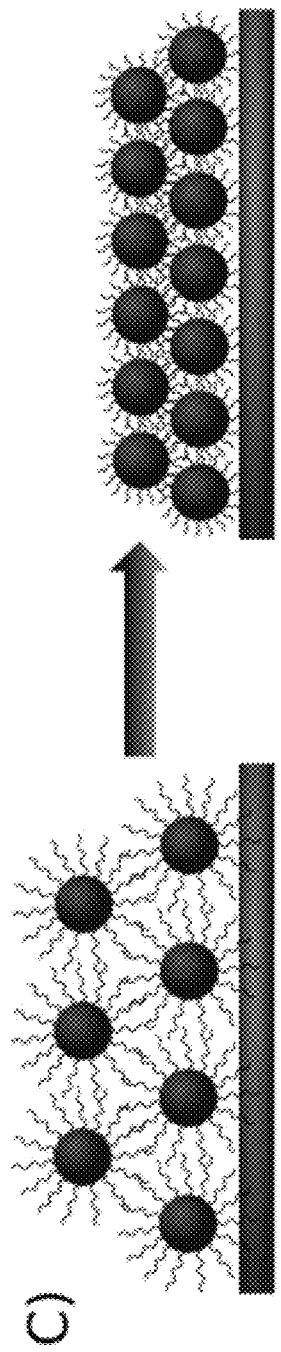
Figure 4C:
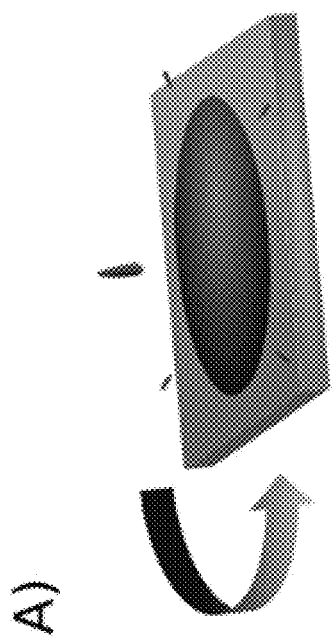
Figure 4C:
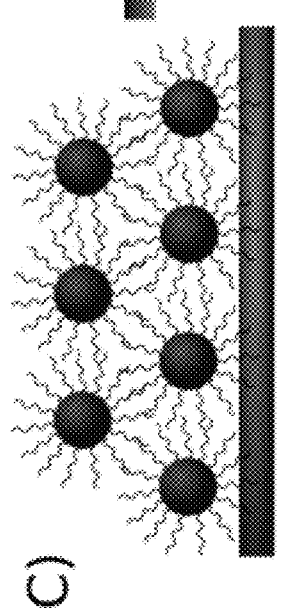

Referring now to FIGS. 4A-4C, these figures illustrate an example process for producing a photovoltatic junction that includes a layer of quantum dots as the light absorbing material. In (4A), an electron acceptor is shown upon which a circular material may be spun to produce the layer of quantum dots. As shown in (4B), several ligands may be used to adjust the density of the quantum dots within the light absorbing material as shown in (4C). FIG. 4C also illustrates a ligand exchange process whereby one ligand (e.g., oleic acid), shown on the left, can be exchanged for a second ligand (e.g., 1,2-ethane dithol). This process of spin coating and ligand exchange may be repeated to produce photovoltaic junctions, which include multi-layered light absorbing materials.

Figures 5A, 5B:
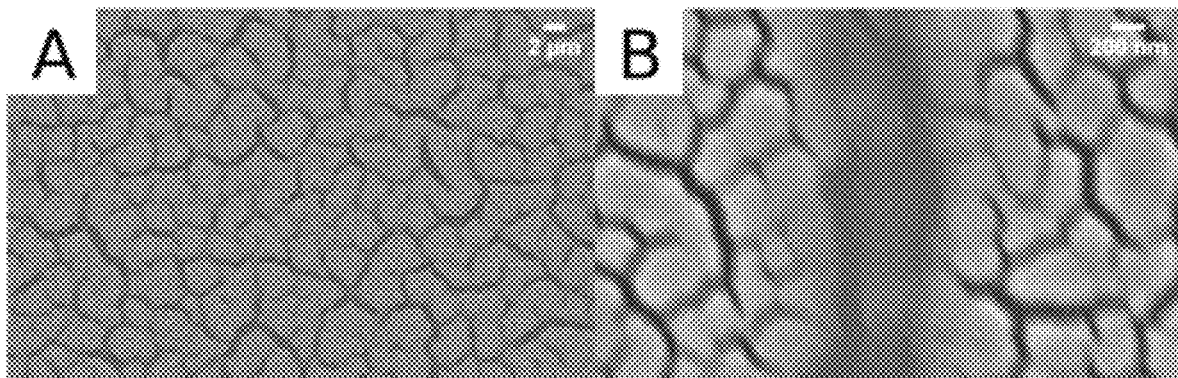
FIGS. 5A-5F illustrate images displaying surface characteristics for portions of example photovoltaic systems in accordance with example embodiments of the disclosure.
Figures 5C, 5D:
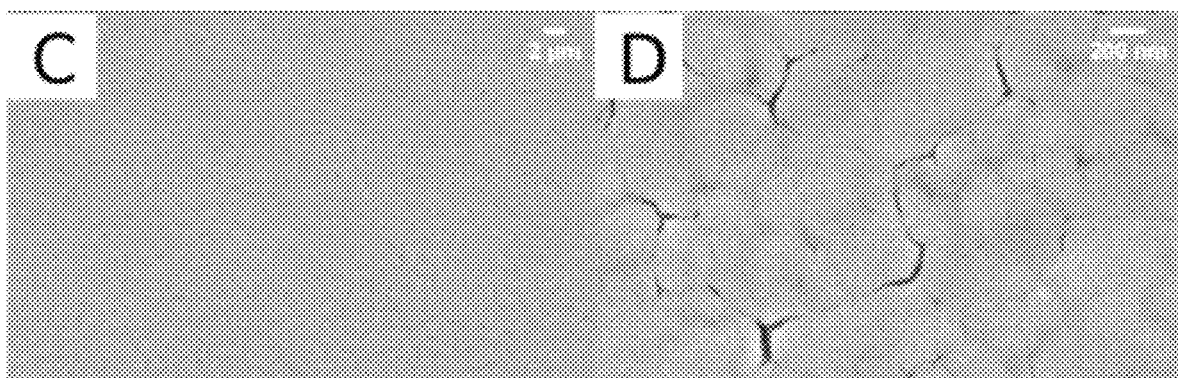
Figures 5E, 5F:
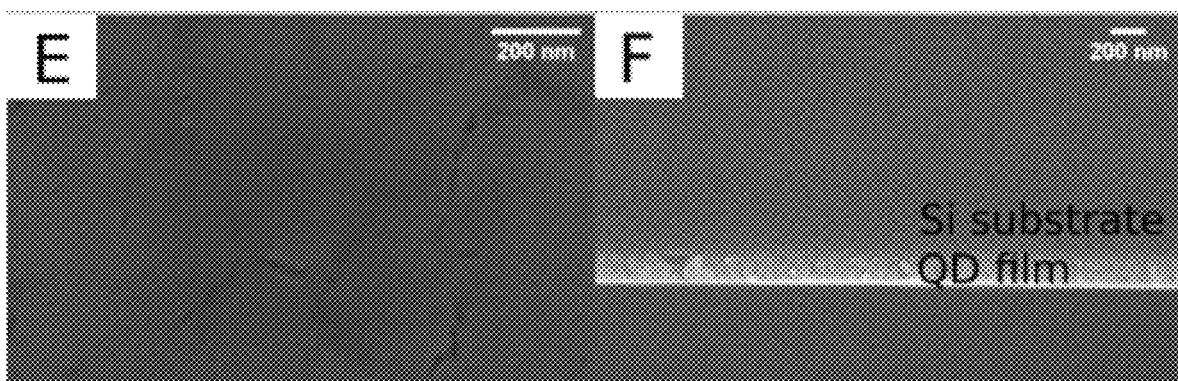

The addition of multiple layers of quantum dots can be used to adjust certain properties of the photovoltaic junctions. For example, referring now to FIGS. 5A-5D, these images illustrate photographs taken of the surface of example photovoltaic junctions that include a single layer of light absorbing material (5A and 5B) or three layers of light absorbing material (5C and 5D). FIGS. 5E and 5F illustrate cross-section images. In addition to physical morphology, the application of multiple layers of quantum dots may be used to alter the carrier lifetime for example devices. Table 1, shown below, provides data for devices that incorporate 0-3 layers of PbS quantum dots deposited on a base SiC chip.

TABLE 1

| Carrier lifetime | | | |
| --- | --- | --- | --- |
| Bare | 1 Layer | 2 Layer | 3 Layer |
| 6.5 ms | 9 ms | 16 ms | 82 ms |

The invention claimed is:

1. A photovoltaic junction comprising:
    a first layer comprising a light absorbing material, the light absorbing material comprising a plurality of quantum dots;
    a second layer comprising a semiconductor, a first surface area of the second layer forming a first physical junction with a first surface area of the first layer, the first physical junction forming a first diode that exhibits Shockley-Read Hall trap-assisted recombination; and
    a third layer comprising graphene, a first surface area of the third layer forming a second physical junction with a second surface area of the second layer, the second physical junction forming a second diode, wherein the second diode is a Schottky diode, a second surface area of the third layer forming a third physical junction with a second surface area of the first layer, the third physical junction forming an ohmic contact, wherein
    the photovoltaic junction provides absorption across one or more wavelengths in the range from about 200 nm to about 2000 nm.

2. The photovoltaic junction of claim 1, wherein the plurality of quantum dots includes a plurality of lead sulfide quantum dots.

3. The photovoltaic junction of claim 1, wherein the first layer includes the plurality of quantum dots in a thin film.

4. The photovoltaic junction of claim 3, wherein the thin film includes a thickness from about 8 nm to about 400 nm.

5. The photovoltaic junction of claim 1, wherein the semiconductor has a bandgap greater than a bandgap of the first layer.

6. The photovoltaic junction of claim 1, wherein the semiconductor comprises a nitride.

7. The photovoltaic junction of claim 1, wherein the semiconductor comprises a carbide.

8. The photovoltaic junction of claim 1, wherein the graphene includes multiple monolayers of graphene.

9. The photovoltaic junction of claim 8, wherein the graphene includes from about 5 monolayers to about 90 monolayers of graphene.

10. The photovoltaic junction of claim 1, wherein the first layer has a thickness of from about 10 nm to about 300 nm.

11. The photovoltaic junction of claim 1, wherein the second layer has a thickness that is greater than the thickness of the first layer.

12. The photovoltaic junction of claim 1, wherein the second layer has a thickness that is from about 5 micrometers to about 200 micrometers.

* * * * *